United States Patent [19]
Richman

[11] Patent Number: 5,249,354
[45] Date of Patent: Oct. 5, 1993

[54] METHOD OF MAKING ELECTRONIC COMPONENT PACKAGES

[75] Inventor: Russell M. Richman, Chatham, N.J.

[73] Assignee: American Telephone & Telegraph Co., New York, N.Y.

[21] Appl. No.: 874,460

[22] Filed: Apr. 24, 1992

Related U.S. Application Data

[63] Continuation-in-part of Ser. No. 765,285, Sep. 25, 1991, abandoned.

[51] Int. Cl.$^5$ .............................................. H01R 43/00
[52] U.S. Cl. ...................................... 29/827; 437/220
[58] Field of Search .................... 29/827; 174/52.4; 437/220

[56] References Cited

U.S. PATENT DOCUMENTS

| | | | |
|---|---|---|---|
| 4,079,511 | 3/1978 | Grabbe | 29/827 |
| 4,774,635 | 9/1988 | Greenberg et al. | 361/421 |
| 4,801,765 | 1/1989 | Moyer et al. | 174/52.4 |
| 5,014,113 | 5/1991 | Casto | 174/52.4 X |

FOREIGN PATENT DOCUMENTS

| | | | |
|---|---|---|---|
| 56-50551 | 5/1981 | Japan | 29/827 |
| 60-84854 | 5/1985 | Japan | |
| 151259 | 6/1989 | Japan | |
| 2-22851 | 1/1990 | Japan | |
| 2-54567 | 2/1990 | Japan | |

OTHER PUBLICATIONS

IBM Technical Disclosure Bulletin, vol. 29, No. 6, Nov. 1986, pp. 2486-2487.

Primary Examiner—Carl J. Arbes

[57] ABSTRACT

A method of making a semiconductor integrated circuit package (20) containing a chip (25)—and/or other active or passive electronic component(s)—enclosed in an encapsulation layer (24) can be made thinner by abandoning the limitation of equality of thicknesses of electrically conductive lead frame fingers (21) and paddle (mounting pad, 22)—the latter of which supports the chip (25) during fabrication of the package prior to encapsulation. As a result, a desired downset d of the paddle (22) with respect to inner portions (21.1) of the conductive fingers (21) automatically occurs without any bending of any die paddle support fingers—the latter of which support the paddle during fabrication of the package. The paddle (22) advantageously is made by preparing a metallic pad sheet having a thickness equal to that of the paddle (22), and then dividing it into a multiplicity of pieces, each of the pieces having a contour such that the piece is suitable for use as the paddle (22).

27 Claims, 3 Drawing Sheets

METHOD OF MAKING ELECTRONIC COMPONENT PACKAGES

CROSS-REFERENCE TO RELATED APPLICATION

This application is a continuation-in-part of Ser. No. 07/765,285 filed Sep. 25, 1991, now abandoned.

FIELD OF THE INVENTION

This invention relates to electronic component packages and more particularly to semiconductor integrated circuit packages.

BACKGROUND OF THE INVENTION

In a standard package—for example, as described in U.S. Pat. No. 4,774,635 or as illustrated in FIG. 1—an electronic component such as a semiconductor integrated circuit chip 15 (FIG. 1) is electrically connected to external circuitry by means of electrically conductive wires (or "wire segments") 13 and electrically conductive fingers 11. These conductive fingers 11 originally are formed by patterning, as by etching or stamping, a typically rectangular metal sheet or strip of metal ("lead frame" or simple "frame"), typically comprising copper, in its vertical Z (thickness) direction in accordance with a prescribed pattern in the horizontal XY plane of a major surface of the frame. Hence, the term "lead frame fingers" can be applied to the conductive fingers 11. The metal frame initially has a relatively thick peripheral portion running along its perimeter. Typically, the conductive fingers 11 (initially not bent) radiate inward either from two opposing sides of from all four sides of the frame toward a central region thereof where the chip ("die") 15 is to be located. Also radiating inward from each of the four corners of the perimeter of the frame is a finger, to be referred to as an "auxiliary support finger" or simply "auxiliary finger" (not shown). More particularly, each such auxiliary finger radiates inwardly typically to a respective corner of a square or rectangular metal plate 12, to be referred to as a "mounting pad" (also known as a "die paddle" or simply a "paddle").

The mounting pad 12 initially is part of a central portion of the frame and hence initially is integral with the conductive fingers 11, i.e., prior to the patterning, as by the etching or stamping. The mounting pad 112 is also integral with the auxiliary fingers. The mounting pad 12, being made of (thermally conducting) metal, thus advantageously facilitates heat dissipation from the chip 15 to the surrounding environment.

The mounting pad 12, the conductive fingers 11, and the auxiliary fingers are all simultaneously formed by the aforementioned patterning of the frame. During this patterning, an inner portion 11.1 of each conductive finger 11—i.e., the portion of each conductive finger 11 located closest to the mounting pad 12—is removed, so that a prescribed horizontal distance L separates each conductive finger 11 from the mounting 12. On the other hand, the auxiliary fingers remain integral with the pad 12. These auxiliary fingers thus supply mechanical support for the mounting pad 12 until after the encapsulation layer 14 has been formed, as described below.

The auxiliary fingers are then bent by a precision bending step, typically using a standard forming tool, in such a way as to provide a prescribed "downset" D for the die paddle 12—i.e., a distance D between the top surface of the die paddle 12 and the top surface of the inner ("internal") portion 11.1 of each of the conductive fingers 11. Optionally, the conductive fingers are, together with the mounting pad and auxiliary fingers, then plated with a precious metal.

The bottom major surface of the chip 15 is then bonded to the mounting pad 12, typically by an epoxy adhesive; and electrical contact pads 17, located on the top major surface of the chip 15, are electrically coupled to the conductive fingers 11 via the electrically conductive wires 13. The assembly comprising the conductive wires 13, the mounting pad 12, the chip 15, and the internal portion 11.1 of the conductive fingers 11 ("internal fingers 11.1") are then enclosed, with the aid of a suitable metallic molding tool, in the encapsulation layer 14, such as an epoxy or plastic molding compound. The conductive fingers 11 are then severed from the thick peripheral portion of the frame at a prescribed position on the thin portion of the frame located between the thick peripheral portion and the boundary of the encapsulation layer 14. The resulting severed conductive fingers 11 thus have outer portions ("external fingers") 11.2 of desired lengths. The auxiliary fingers (not shown), however, are severed typically flush with the boundary of the encapsulation layer 14, so that virtually no external portion of these auxiliary fingers remains, but only auxiliary finger remnants (not shown) remain.

The external fingers 11.2 are then shaped, typically by bending, whereby their bottom surfaces fall below the bottom surface of the encapsulation layer 14. In this way the electrical contact pads 17 located inside the package 10 can be electrically connected through the conductive fingers 11 to the external circuitry, such as a second level interconnection board, which is typically a printed wiring board or printed circuit board. The amount of this bending is selected to ensure proper contact of the external fingers 11.2 to the printed wiring (or printed circuit) board and to leave sufficient space for cleaning solution to penetrate between the underside of the package and the top surface of the board. The thus severed conductive fingers 11 therefore constitute the I/O (Input/Output) conductive leads for the circuitry of the semiconductor chip 15.

The above-mentioned downset distance D of die paddle support fingers is desirable to ensure that the wires 13 are set at the proper level within the thickness of the encapsulation layer 14—i.e., so that the top of these (wires) wire segments do not protrude outside of the top surface of the encapsulation layer 14.

This packaging scheme results in a package 10 in which the thickness of the paddle 12 is equal to the mutually equal thicknesses of the conductive fingers 11 and the auxiliary support fingers, since they were all derived, by patterned etching or stamping, from the same frame in regions thereof where it had a uniform thickness. In particular, this uniform thickness typically is equal to approximately 0.15 mm, in order to assure sufficient electrical conductivity, as well as to assure sufficient mechanical strength and robustness of the conductive fingers 11 especially in the finished package, and to assure sufficient mechanical strength and robustness of the auxiliary support fingers during fabrication of the package. This equality of the thicknesses of the paddle 12 and of the conductive fingers 11 imposes an undesirable limitation on how much the thickness of the package 10—i.e., the thickness of the encapsulation layer 14—can be reduced.

In order to avoid this limitation on how much the thickness of the package can be reduced, Japanese Kokai Patent Application No. Hei 1[1989] 1-151259, published on Jun. 14, 1989, teaches a thinner package by utilizing a thin mounting pad—that is, a mounting pad which has been made (by patterning) from the same frame as that from which the conductive fingers have been made (by patterning), but which has been made thinner than the conductive fingers by means of etching a selected portion of one of the major surfaces of the frame prior to attaching the chip to the resulting thinner portion of the frame, i.e., the portion that then serves as the mounting pad. However, such etching involves a time-consuming, complex, and costly two-sided masking procedure, as well as a procedure in which control over the resulting thickness is difficult. Moreover, the etched surfaces are not as smooth as is desired, particularly for bonding the bottom major surface of the chip to the top major surface of the mounting pad.

Therefore, it would be desirable to have a method of making a thinner package utilizing a mounting pad that is thinner than the conductive fingers but is not made to be thinner by means of an etching procedure.

SUMMARY OF THE INVENTION

This invention involves a method of mass production of a multiplicity of desirably thin mounting pads for electronic component packages, such as semiconductor integrated circuit packages. Each of the packages (e.g. 20) comprises a selected (horizontal) metallic mounting pad (e.g. 22) having a prescribed (vertical) thickness and typically having auxiliary regions (e.g. 22.1) that are located at strategic position along its periphery. In addition, one or more electronic components such as the semiconductor integrated circuit chip (e.g. 25) has a bottom major surface that is bonded to the top surface of the mounting pad. Each of the packages further comprises a first plurality of electrically conductive fingers (e.g., 21) each having a (vertical) thickness at one end portion thereof ("internal finger portion" or simply "internal finger"—e.g., 21.1), the internal finger portion being that portion of the finger which is located in close proximity with an edge of the semiconductor chip. Advantageously, the prescribed (vertical) thickness of the mounting pad is smaller than the (vertical) thickness of the internal portion of any of the conductive fingers.

The package still further comprises remnants (e.g. 31) of auxiliary support fingers ("auxiliary support finger remnants"). These remnants and the conductive fingers typically all stem from a metallic frame from which they have all been patterned and severed, but the mounting pad and its auxiliary regions do not stem from the frame. The auxiliary support finger remnants (e.g., 31) have been bonded to the respective auxiliary regions of the mounting pad. Since the auxiliary support fingers initially are part of the frame and have been bonded to the auxiliary regions of the mounting pad, they thus supply physical support for the mounting pad during fabrication of the package. Further, the package includes typically at least one wire segment (e.g. 23) that has one of its ends bonded to a bonding pad (e.g. 27), typically through a solder ball (e.g., 26), located on the top surface of the chip; and the wire segment has another of its end bonded to the internal finger portion of at least one of the conductive fingers.

The package also comprises an encapsulation layer (e.g., 24) enclosing the chip, the mounting pad, and the wire segment. After formation of the encapsulation layer (e.g. 24), however, the auxiliary support fingers are severed from the frame, typically at respective locations that are flush with respective edges of the encapsulation layer, so that only the aforementioned auxiliary support finger remnants remain in the package. On the other hand, after formation of the encapsulation layer the conductive fingers are severed from the frame at prescribed distances from the respective edges of the encapsulation layer, so that an external portion of each of the conductive fingers ("external finger portion" or simply "external finger") protrudes outside the encapsulation layer. Thus the encapsulation layer also encloses the auxiliary support finger remnants and the internal finger portions.

The inventive method includes the steps of:

providing a metallic pad sheet, having the prescribed thickness, and having an area that is sufficient so that the sheet can be divided into a multiplicity of mounting pads; followed by dividing the sheet into a second plurality (equal to or greater than the multiplicity) of metallic mounting pads of mounting pad regions; followed by bonding the auxiliary support fingers, respectively, to the auxiliary regions of a selected one of the mounting pads or a selected one of the mounting pad regions; followed by trimming, if need be, edges of the selected one of the mounting pad regions, if any, whereby the selected mounting pad is formed either by the thus trimmed mounting pad region or (without the need for trimming) by the selected one of the mounting pads.

The method advantageously also includes the step of bonding the bottom major surface of the chip to the top major surface of the selected one of the mounting pads.

The method advantageously further includes the step of enclosing the selected mounting pad, the chip, and the internal portion of each of the conductive fingers with the encapsulation layer, whereby the internal portion of each of the conductive fingers and of each of the auxiliary support fingers is located inside the encapsulation layer and the external portion of each of the conductive fingers and of each of the auxiliary support fingers is located outside the encapsulation layer. Each of the conductive fingers and each of the auxiliary support fingers can then be severed at suitable respective locations relative to the encapsulation layer, in order to sever all the fingers from the frame. The auxiliary support fingers cut are thus severed typically flush with the edges of the encapsulation layer, and the conductive fingers typically are all severed advantageously at prescribed distances from the respective (nearest) edges of the encapsulation layer.

In this way, a multiplicity of mounting pads can be formed in a manner suitable for mass production of these pads, each of which can be used for mass production of separate packages without resorting to or requiring the etching procedure described in the aforementioned Japanese Kokai Patent Application. In addition, without any bending of the conductive fingers being required, in this way a downset d between the top surfaces of the mounting pad and of each of the internal fingers will automatically be achieved.

Advantageously also, the sheet can be prepared by first providing a sheet with a relatively large thickness and later thinning it by mechanically rolling to the relatively small thickness suitable for all the mounting pads. Alternatively, the sheet advantageously can be prepared with the prescribed thickness, as by electrochemical deposition of the sheet to the prescribed thickness on the surface of a drum from which the sheet is subsequently removed, as by peeling.

The method advantageously further includes the step of bonding one end of the wire segment to a bonding pad located on the chip and bonding the other of the wire segment to the aforementioned internal end portion of the conductive finger.

BRIEF DESCRIPTION OF THE DRAWING

FIGS. 1, 2 and 4 are all drawn to approximately the same scale. Only for the sake of clarity, FIGS. 3, 5, and 6 are not drawn to any scale. Again only for the sake of clarity, in FIGS. 3, 5, and 6, the boundary of an encapsulation layer 24 is shown as a dashed line, as though it had not yet been formed, so that boundary lines of other elements everywhere are shown as solid lines. Elements in FIG. 2 that are similar to those in FIG. 1 are denoted by the same reference numerals plus ten.

DETAILED DESCRIPTION

Figure 1:
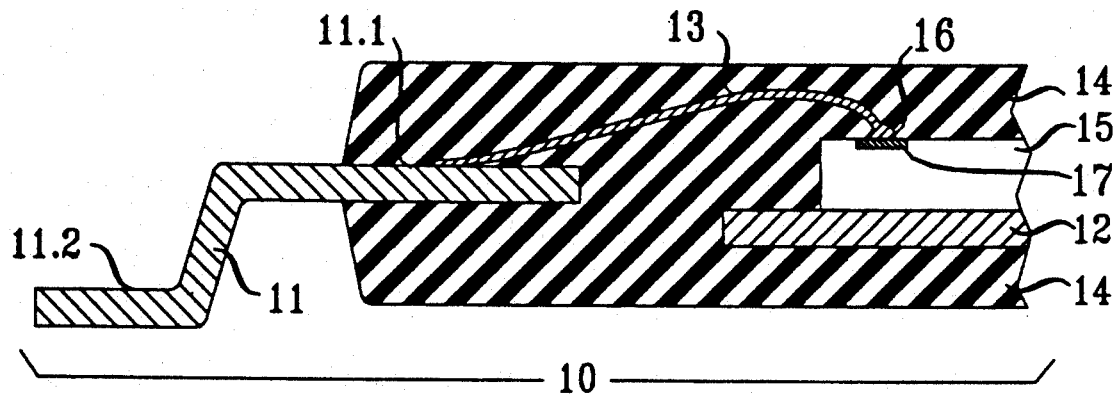
FIG. 1 is a side view in cross section of a portion of a semiconductor integrated circuit package of typical prior art.

In a typical portion of a prior-art device package 10 (FIG. 1), the thickness of the conductive finger 11 is approximately equal to 0.15 mm; and the thickness of the mounting pad 12 is thus also approximately equal to 0.15 mm. The height that the wire segment 13 extends above the top surface of the chip 15 is approximately equal to 0.25 mm. One end of this wire segment 13 is attached to an electrically conductive bonding pad 17 located on the top surface of the chip ("die") 15 via a metallic glob ("ball") 16 formed at the beginning of the bonding procedure; the other end of this wire segment 13 is attached to the top surface of the internal finger portion 11.1, as by a thermal compression bonding subsequent to the bonding to the pad 17. The thickness T of the encapsulation layer 14 ordinarily is bisected by the center of the thickness of the internal finger portion 11.1, in accordance with the properties of ordinary encapsulation materials. This thickness T of the encapsulation material 14 is approximately equal to 1.0 mm. The thickness of the semiconductor chip 15 is approximately equal to 0.3 mm. The ("down-set") distance D between the top surfaces of the internal finger portion 11.1 and the mounting pad 12 is approximately equal to 0.18 mm. The "stand-off" height—i.e., the distance between the bottom surface of the encapsulation layer 14 and the bottom surface of the external finger portion 11.2—is approximately equal to 0.10 mm or less.

Figure 2:
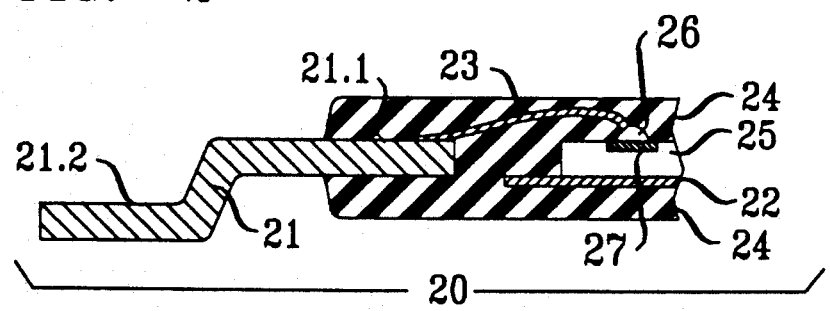
FIG. 2 is a side view in cross section of a portion of a semiconductor package, integrated circuit in accordance with a specific embodiment of the invention.
Figure 4:
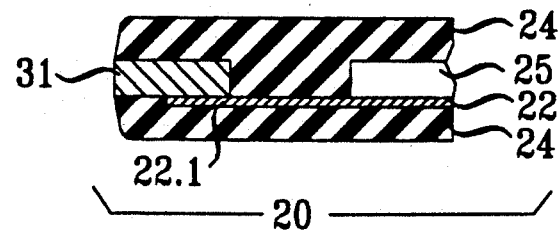
FIG. 4 is a side view in cross section of another portion of the semiconductor integrated circuit package of FIG. 3, in accordance with a specific embodiment of the invention.
Figure 3:
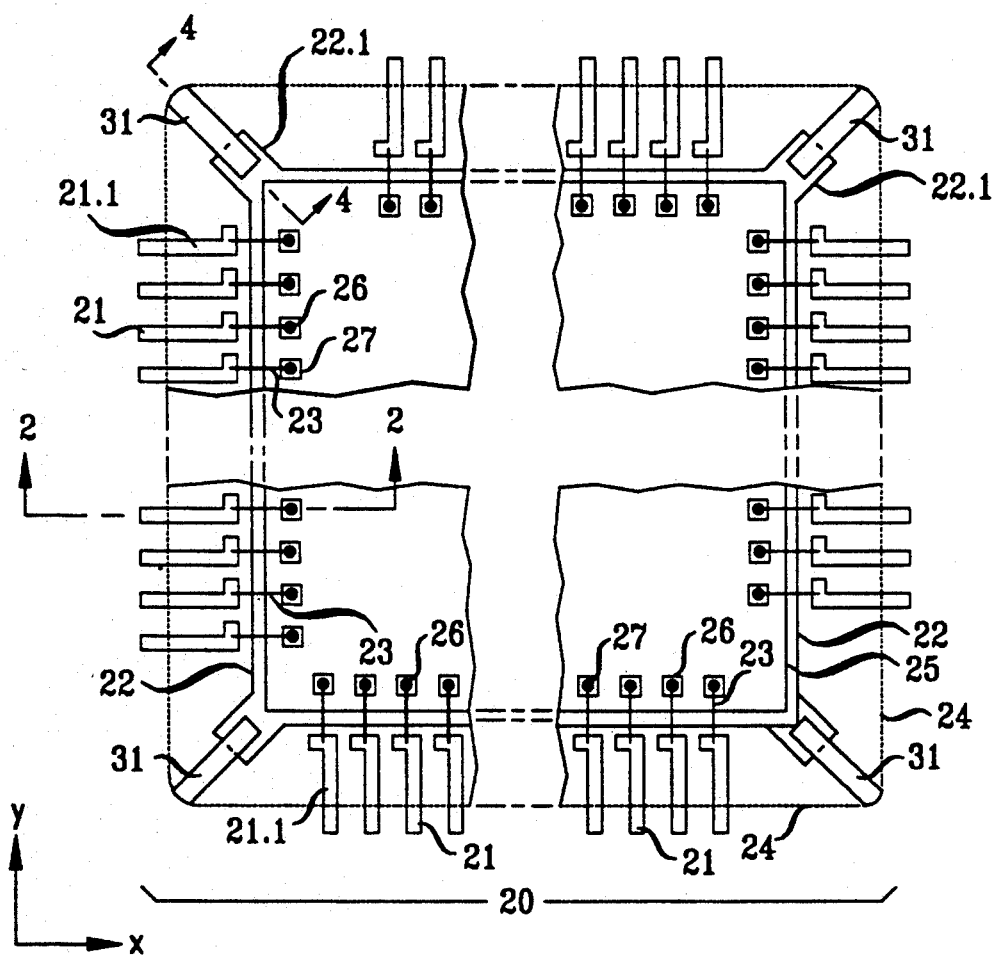
FIG. 3 is a top view of the package shown in FIG. 2, in accordance with a specific embodiment of the invention.

Indicated portions (FIGS. 2, 3, 4) of a semiconductor device package 20 in accordance with a specific embodiment of the invention include a semiconductor integrated circuit chip 25 having a plurality of bonding pads 27 (FIG. 3). To each of these bonding pads 27 one end of an electrically conductive wire segment 23 is attached through a solder ball 26, typically produced by heating the wire bonding segment, as by thermocompression bonding. The other end of each wire segment 23 is attached, as by thermal compression bonding, to the top surface of an internal finger portion 21.1 of an electrically conductive metallic finger 21. An outer ("external") portion of the conductive (metallic) finger 21 is bent, whereby an external finger portion 21.2 is defined and is to be utilized for mounting the package 20 onto a printed-circuit board (not shown), for example.

One major (bottom) surface of the semiconductor chip 25 is bonded, as by an electrically conductive or nonconductive epoxy layer (not shown), to a metallic mounting pad 22. Except at the four corners of the chip 25, this mounting pad 22 everywhere laterally protrudes a distance p beyond the bottom perimeter of the chip 25. Typically the distance p is equal to or greater than approximately 0.25 mm. The assembly formed by the internal finger portions 21.1, the auxiliary finger remnants 31, the mounting pad 22, the wire segments 23, and the chip 25 is enclosed in an electrically insulating encapsulation layer 24, typically by having been molded by a plastic molding compound or an electrically insulating epoxy cement in a suitable metallic molding apparatus. Again, the vertical thickness t of this encapsulation layer 24 ordinarily is bisected by the center of the thickness of the internal finger portions 21.1, in accordance with the properties of ordinary encapsulating materials.

At each of the four corners of the mounting pad 22, this pad has an auxiliary region 22.1 (FIGS. 3 and 4) where it comes in contact with and is bonded to a separate auxiliary support finger remnant 31. Here the mounting pad 22 protrudes a distance P beyond the underside edge of the chip 25, with P advantageously being equal to at least 2 p, preferably at least 3 p.

Each of the auxiliary support finger stems from the same frame (not shown) as does each of the conductive fingers 21. All these fingers are patterned from the frame, as by stamping or etching. During fabrication of the package 20, either prior to severing of the fingers from the frame or thereafter, the auxiliary support fingers are never bent—such bending being required in prior art, in order to achieve a downset. Nevertheless, a downset d will still occur between the top surface of the mounting pad 22 and the top surface of the auxiliary support finger remnant 31 (FIG. 4), and this downward d automatically will be equal to the thickness of the auxiliary support finger remnant 31, without any bending of the auxiliary support fingers. Since the thickness of the auxiliary support finger remnant 31 is equal to the thickness of the conductive fingers 21—because they all stem from a central region of a single frame (where the frame had uniform thickness)—the downset of the top surface of the mounting pad 22 with respect to the top surface of the internal finger portion 21.1 automatically will advantageously also be equal to d, again without any bending of the auxiliary support fingers.

Figure 5:
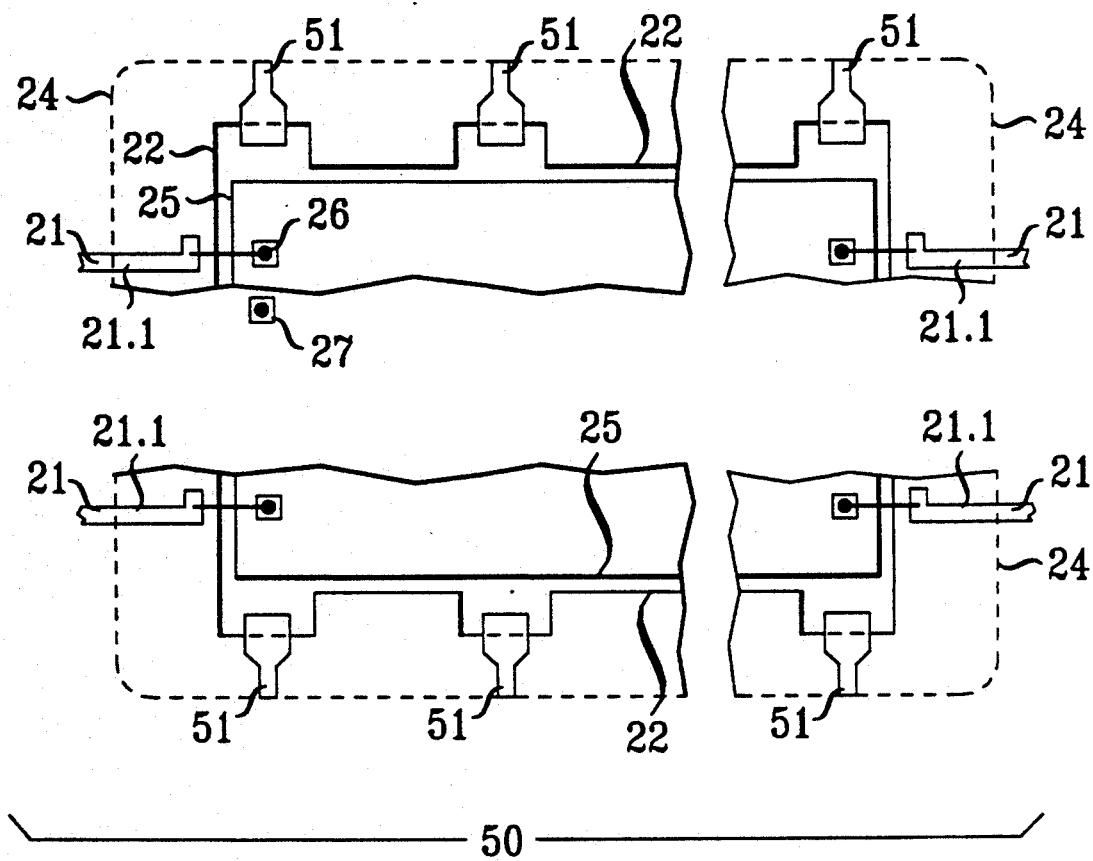
FIG. 5 is a top view of a semiconductor integrated circuit package, in accordance with another specific embodiment of the invention.
Figure 6:
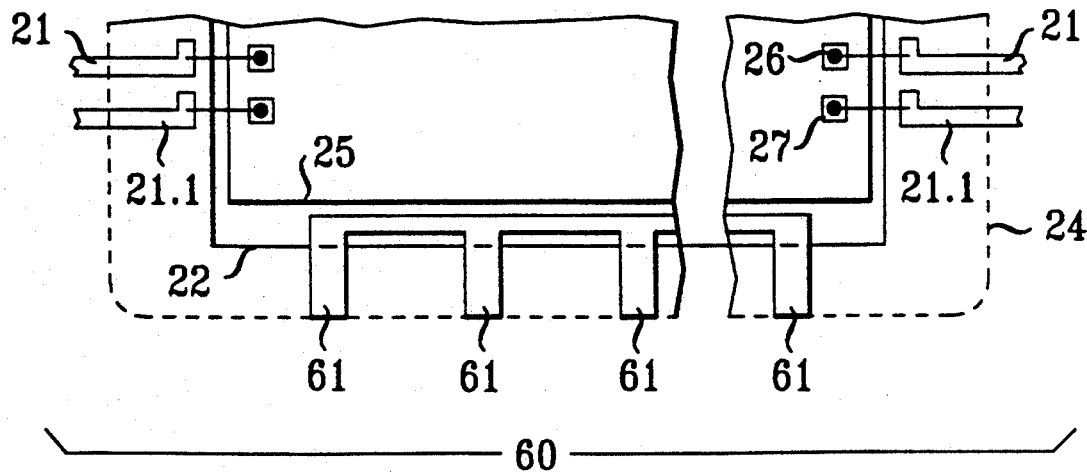
FIG. 6 is a top view of a semiconductor integrated circuit package, in accordance with yet another specific embodiment of the invention.

FIGS. 5 and 6 depict top views of two alternatives for layouts of the auxiliary support finger remnants 51 and 61, respectively, that are especially useful in case the conductive fingers 21 are located on opposing sides of the chip 25. Elements shown in FIGS. 5 and 6 that are similar to those shown in FIGS. 1, 2, 3, and 4 are denoted by the same reference numerals. In the portion of the package 60 shown in FIG. 6, the number of auxiliary support finger remnants 61 can be limited to two, each being located at a corner of the mounting pad 22 and running parallel or obliquely with respect to an extension of a side of the pad.

The mounting pad 22 (FIGS. 2, 3, 4, 5, 6) is advantageously a sheet of metal ("pad sheet") such as copper, whose initial thickness has been reduced by a mechanically thinning process, such as mechanical rolling. The resulting (i.e., mechanically thinned) pad sheet is then divided into pieces—as by mechanical cutting (stamping) or by chemical photoetching—each of the pieces having a geometrical shape in accordance with the desired contours of the mounting pad 22. Thus each of the pieces is suitable for use as the mounting pad 22 of a separate package, whereby mass production of mounting pads for many packages (each identical to the package 10) is facilitated.

The division of the pad sheet into the pieces can advantageously be performed in stages. First, the mechanically thinned sheet is patterned—as by mechanical cutting or by chemical photolithographic etching—into the multiplicity of pad regions, each having the geometrical shape in accordance with the desired contours of the mounting pad 22, except that adjacent mounting pad regions, for the purpose of mutual mechanical support, are still attached to each other at their corners or at other temporary (support) portions of their perimeters. These temporary (support) portions can thus either be spaced apart from or be part of the auxiliary support fingers. Then, when subsequently ready for use in fabricating a package, one of the pad regions located along the periphery of the multiplicity of the thus mutually attached region pads is mechanically severed from its neighbor(s), in order to form the mounting pad 22. This mounting pad 22 is then fit into place with respect to, and bonded to, the auxiliary support fingers, typically by means of an epoxy or other adhesive, thermal compression bonding, spot welding, or soldering. In this way the auxiliary support fingers supply mechanical support for the mounting pad 22.1 during further processing. The number of pads or pad regions obviously is equal to or greater than the number of packages to be made.

The conductive fingers 21 and the auxiliary fingers (having remnants 31 in FIGS. 3 and 4, remnants 51 in FIG. 5, and remnants 61 in FIG. 6) are all formed by patterning, as by etching or stamping, a metallic frame, again typically comprising copper. Then the conductive fingers 21 (together with the auxiliary fingers) can be plated with a precious metal, if desired.

After thus preparing the conductive fingers 21 and after thus selecting and preparing the mounting pad 22, and having bonded its auxiliary regions 22.1 to the auxiliary support fingers, the semiconductor chip 25 is bonded to this mounting pad 22 as thus supported by the auxiliary support fingers. Then one end of each of the wire segments 23 is bonded to the respective bonding pad 27, and the other end of each of the wire segments 23 is bonded to the top surface of the respective conductive finger 21. Next, the encapsulation layer 24 is formed, as by a standard molding procedure. In this way, the mounting pad 22, the wire segments 23, the chip 25, the internal portions 21.1 of the conductive fingers 21, and an internal end portion of each of the auxiliary fingers 31 (or 51 or 61) are enclosed in the encapsulation layer 24. Then the portions (not shown) of the auxiliary support fingers that protrude outside the encapsulation layer 24 are severed from the frame, advantageously at locations that are flush with the boundary edges of this encapsulation layer 24, whereby only the remnants 31 (or 51 or 61) of the auxiliary support fingers remain in the package 20, these fingers having performed their support function during the above-described processing: the mechanical support is thereafter supplied by the encapsulation layer 24.

On the other hand, the external finger portions 21.1 are severed from the frame at locations that are removed by a prescribed horizontal distance from the boundary edges of the encapsulation layer. The conductive fingers thus project outside the encapsulation layer by the prescribed distance. Their external portions 21.2 are then bent, and ultimately they are bonded to external conductive pads or to external wiring or the like, for example, of a printed wiring board or printed circuit board, for external interconnections.

The chip 25 is typically silicon having been formed from a silicon wafer having an area sufficient to produce many chips, and with an original thickness of approximately 0.5 mm. Typically, a protective coating—e.g., photoresist, is deposited on the top surface of the wafer. The bottom surface of the wafer typically is then mechanically ground, wet etched, and polished to the desired thickness of 0.15 mm. Then the protective coating is removed, typically with a suitable solvent, and the wafer is cut into the desired silicon chips.

Although the invention has been described in detail with respect to specific embodiments, various modifications can be made without departing from the scope of the invention. For example, one or more of the bonding pads need not be connected to any conductive finger, and one or more of the bonding pads can be connected to an auxiliary support finger (that projects outside the encapsulation layer 24 instead of having been severed at a location that is flush with a boundary edge of the encapsulation layer). Thus, the number of bonding pads need not be equal to the number of conductive fingers.

Instead of having the thinned sheet standing alone, it can advantageously be mounted on a polyimide tape or other mechanical support until it is ready for use in fabricating a package—i.e. until after its having been patterned.

Instead of mechanically thinning, the sheet can be formed initially by electrodeposition of a metallic foil (layer; sheet) on a cylindrical drum made of an electrically conducting material from which the resulting electrodeposited sheet can be peeled; the electrodeposited sheet is stripped off the drum, and divided into either the pieces or the mounting pad regions described above, with or without first having been mechanically mounted on a tape.

Also, multi-chip packages can be achieved by increasing the area of the mounting pad, and at the same time mounting additional chips on the resulting added (otherwise vacant) area. In such multi-chip packages, some or all of the auxiliary support fingers that are located at the corners of adjacent chips can be designed to support both chips. Alternatively, each chip in a multi-chip package is mounted on a separate pad with all the pads being supported by a pad support structure (which can be planar), whereby stresses can be reduced. Moreover, portions of this pad support structure can be made of a sheet of insulating material—e.g., a plastic or a polyimide—upon which the (mechanically thinned) pad sheet was initially mounted everywhere and subsequently patterned, as by chemical photolithographic etching.

The support fingers 61 located on adjacent sides of the (rectangular) mounting pad 22 can be interconnected at the corners of the chip 25 (instead of being disconnected at these corners as shown in FIG. 6).

Moreover, as an alternative, a mounting-pad-region strip, composed of a linear array (extending in an X-direction, say) of mounting pad regions can be formed, the array having the same thickness as that of each (ultimately desired) mounting pad 22. In this linear array, adjacent ones of the mounting pad regions are initially joined together and mechanically supported by virtue of temporary mounting-pad-support fingers (not shown) that extend to a pair of runners (running along the X-direction) located on either side of the array of the mounting pad regions. These runners, temporary mounting-pad-support fingers, and mounting pad regions can all have the same thickness and can have been formed by mechanical stamping or chemical photolithographic etching of a uniformly thick pad sheet. The runners themselves advantageously are aligned, as by means of pins on a suitable fixture, to the edges of a linear array of frames (also running along the X-direction), whereby the linear array of mounting pad regions overlies the linear array of frames. The auxiliary support regions 22.1 of a selected mounting pad region are bonded to the auxiliary support fingers of the underlying frame. Next, the temporary mounting-pad-support fingers are severed, as by mechanical stamping or photolithographic chemical etching, at locations along the periphery of the thus selected mounting pad region, whereby the mounting pad 22 is formed. Then the semiconductor chip 25 is mounted on and bonded to this mounting pad 22. Next, the wire segment 23 is bonded at one of its ends to the bonding pad 27 and at the other of its ends to the top surface of the internal finger portion 21.1. Next, the assembly being formed is enclosed in the encapsulation layer, and both the conductive fingers 21 and the auxiliary support fingers are severed at desired locations. Then, the external fingers 21.2 are bent, in order to form a stand-alone package.

Instead of, or in addition, to the semiconductor chip 25, other types of electronic components—active and-/or passive and/or including the chip 25—can be bonded to the mounting pad 22 and can be connected via wire segments 23 to the internal portions 21.1 of the conductive fingers 21 and to one another.

I claim:
1. A method of making a multiplicity of electronic component packages, each of the packages comprising
   (1) providing a selected metallic mounting pad having a prescribed thickness and having auxiliary regions that are bonded to respective auxiliary support fingers, and
   (2) providing a first plurality of conductive fingers, each of the conductive fingers having a thickness at an internal end portion thereof, the prescribed thickness of the mounting pad being less than the thickness of the internal end portion of any of the conductive fingers, the method including the steps of:
   (a) mechanically thinning an initial metallic sheet having an initial thickness that is more than the prescribed thickness whereby a metallic pad sheet is formed having the prescribed thickness, and having an area that is sufficient for dividing the sheet into a number of the mounting pads equal to at least the multiplicity; followed by
   (b) dividing the sheet into a second plurality of mounting pads or mounting pad regions, the second plurality being equal to or greater than the multiplicity; followed by
   (c) selecting one of the second plurality of the mounting pads for mounting pad regions, to provide a selected mounting pad; and followed by
   (d) bonding the auxiliary support fingers, respectively, to the auxiliary regions of the selected mounting pad.

2. The method of claim 1 further including, subsequent to step (d), the step of:
   bonding a first major surface of an electronic component to the major surface of the selected mounting pad.

3. The method of claim 2 further including the steps of:
   bonding one end of a wire segment to a bonding pad located on the component;
   bonding the other end of the wire segment to the internal end portion of at least one of the conductive fingers; and
   enclosing the selected mounting pad, the wire segment, the component, and the internal portion of each of the conductive fingers with the encapsulation layer, whereby the internal end portion of each of the conductive fingers is located inside the encapsulation layer and the external end portion of each of the conductive fingers is located outside the encapsulation layer, and whereby the wire segment is enclosed within the encapsulation layer.

4. The method of claim 1, 2, or 3 in which each of the mounting pad regions has the same contour as that of a selected mounting pad except that adjacent mounting pad regions are attached to each other at localized support portions of their perimeters, and in which the selected one of the plurality of mounting pad regions is severed from its adjacent mounting pad region or regions between steps (b) and (d), whereby the selected mounting pad is formed from the selected mounting pad region.

5. The method of claim 4 further including the steps of:
   selecting and severing another of the second plurality of mounting pad regions, to provide another selected mounting pad; followed by
   bonding the auxiliary support fingers, respectively, to the auxiliary regions of the selected mounting pad.

6. The method of claim 5 further including the steps of:
   bonding a first major surface of another electronic component to a major surface of said another selected mounting pad; followed by
   enclosing said another selected mounting pad, said another component, and an end portion of each of a third plurality of other conductive fingers with another encapsulation layer.

7. The method of claim 1, 2, or 3 further including the steps of:

selecting another of the second plurality of mounting pads to provide another selected mounting pad; followed by bonding further ones of the auxiliary support fingers, respectively, to the auxiliary regions of said another selected mounting pad.

8. The method of claim 7 further including the steps of:

bonding a first major surface of another electronic component to a major surface of said another selected mounting pad; and followed by enclosing said another selected mounting pad, said another component, and an end portion of each of a third plurality of other conductive fingers with another encapsulation layer.

9. The method of claim 1 in which the metallic pad sheet is provided by electrodeposition of a metallic sheet having the prescribed thickness immediately after the electrodeposition.

10. The method of claim 9 in which each of the mounting pad regions has the same contour as that of a selected mounting pad except that adjacent mounting pad regions are attached to each other at support portions of their perimeters, and in which the selected one of the plurality of mounting pad regions is severed from its adjacent mounting pad region or regions between steps (b) and (d), whereby the selected mounting pad is formed.

11. The method of claim 10 further including the steps of:

selecting and severing another of the second plurality of mounting pad regions, to provide another selected mounting pad; followed by bonding further ones of the auxiliary support fingers, respectively, to the auxiliary support fingers of said another selected mounting pad.

12. The method of claim 10 further including the steps of:

bonding a first major surface of another electronic component to a major surface of said another selected mounting pad; followed by enclosing said another selected mounting pad, said another component, and an end portion of each of a third plurality of other conductive fingers with another encapsulation layer.

13. The method of claim 9 further including the steps of:

selecting another of the second plurality of mounting pads to provide another selected mounting pad; followed by bonding further ones of the auxiliary support fingers, respectively, to the auxiliary support fingers of said another selected mounting pad.

14. The method of claim 13 further including the steps of:

bonding a first major surface of another electronic component to a major surface of said another selected mounting pad; followed by enclosing said another selected mounting pad, said another component, and an end portion of each of a third plurality of other conductive fingers with another encapsulation layer.

15. The method of claim 9 further including, subsequent to step (d), the step of bonding a first major surface of an electronic component to the major surface of the selected mounting pad.

16. The method of claim 15 further including the steps of:

bonding one end of a wire segment to a bonding pad located on the component; and bonding the other end of the wire segment to the internal end portion of at least one of the conductive fingers.

17. The method of claim 16 in which each of the mounting pad regions has the same contour as that of a selected mounting pad except that adjacent mounting pad regions are attached to each other at support portions of their perimeters, and in which the selected one of the plurality of mounting pad regions is severed from its adjacent mounting pad regions or regions between steps (b) and (d), whereby the selected mounting pad is formed.

18. The method of claim 17 further including the steps of selecting and severing another of the second plurality of pad regions, to provide another selected mounting pad; followed by bonding further ones of the auxiliary support fingers, respectively, to the auxiliary support fingers of said another selected mounting pad.

19. The method of claim 18 further including the steps of:

bonding a first major surface of another electronic component to a major surface of said another selected mounting pad; followed by enclosing said another selected mounting pad, said another component, and an end portion of each of a third plurality of other conductive fingers with another encapsulation layer.

20. The method of claim 15 further including the steps of:

selecting another of the second plurality of mounting pads to provide another selected mounting pad; followed by bonding further ones of the auxiliary support fingers, respectively, to the auxiliary support fingers of said another selected mounting pad.

21. The method of claim 20 further including the steps of:

bonding a first major surface of another electronic component to a major surface of said another selected mounting pad; followed by enclosing said another selected mounting pad, said another component, and an end portion of each of a third plurality of other conductive fingers with another encapsulation layer.

22. The method of claim 16 further including the step of:

enclosing the selected mounting pad, the wire segment, the component, and the internal portion of each of the lead frame fingers with the encapsulation layer, whereby the internal end portion of each of the conductive fingers is located inside the encapsulation layer and the external end portion of each of the conductive fingers is located outside the encapsulation layer, and whereby the wire segment is enclosed within the encapsulation layer.

23. The method of claim 22 in which each of the mounting pad regions has the same contour as that of a selected mounting pad except that adjacent mounting pad regions are attached to each other at support portions of their perimeters, and in which the selected one of the plurality of mounting pad regions is severed from its adjacent mounting pad region or regions between steps (b) and (d), whereby the selected mounting pad is formed.

24. The method of claim 23 further including the steps of
   selecting and severing another of the second plurality of pad regions, to provide another selected mounting pad; followed by
   bonding further ones of the auxiliary support fingers, respectively, to the auxiliary support fingers of said another selected mounting pad.

25. The method of claim 24 further including the steps of:
   bonding a first major surface of another electronic component to a major surface of said another selected mounting pad; and followed by
   enclosing said another selected mounting pad, said another component, and an end portion of each of a third plurality of other conductive fingers with another encapsulation layer.

26. The method of claim 22 further including the steps of:
   selecting another of the second plurality of mounting pads to provide another selected mounting pad; followed by
   bonding further ones of the auxiliary support fingers, respectively, to the auxiliary support fingers of said another selected mounting pad.

27. The method of claim 26 further including the steps of:
   bonding a first major surface of another electronic component to a major surface of said another selected mounting pad; followed by
   enclosing said another selected mounting pad, said another component, and an end portion of each of a third plurality of other conductive fingers with another encapsulation layer.

* * * * *

UNITED STATES PATENT AND TRADEMARK OFFICE
CERTIFICATE OF CORRECTION

PATENT NO. : 5,249,354
DATED : October 5, 1993
INVENTOR(S) : Russell M. Richman

It is certified that error appears in the above-identified patent and that said Letters Patent is hereby corrected as shown below:

Column 12, claim 17, line 14, "regions", first occurrence, should be --region--.

Signed and Sealed this

Twenty-second Day of November, 1994

Attest:

BRUCE LEHMAN

*Attesting Officer*　　　*Commissioner of Patents and Trademarks*